US011192622B2

(12) United States Patent
Cai et al.

(10) Patent No.: US 11,192,622 B2
(45) Date of Patent: Dec. 7, 2021

(54) UNMANNED AERIAL VEHICLE AND HEAT DISSIPATION STRUCTURE

(71) Applicant: SZ DJI TECHNOLOGY CO., LTD., Shenzhen (CN)

(72) Inventors: Zhiwei Cai, Shenzhen (CN); Yawen Zhang, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/687,258

(22) Filed: Nov. 18, 2019

(65) Prior Publication Data

US 2020/0102061 A1    Apr. 2, 2020

Related U.S. Application Data

(63) Continuation of application No. PCT/CN2017/090972, filed on Jun. 30, 2017.

(30) Foreign Application Priority Data

May 19, 2017    (CN) .......................... 201720560892.X (51) Int. Cl.
*H05K 7/20* (2006.01)
*B64C 1/00* (2006.01)
*B64D 47/00* (2006.01)

(52) U.S. Cl.
CPC ................ *B64C 1/00* (2013.01); *B64D 47/00* (2013.01); *H05K 7/20145* (2013.01); *H05K 7/20154* (2013.01)

(58) Field of Classification Search
CPC ...... B64C 1/00; B64D 47/00; H05K 7/20145; H05K 7/20154

(Continued)

(56) References Cited

U.S. PATENT DOCUMENTS 6,483,902 B1 * 11/2002 Stewart ............... H04L 12/2803
379/171
7,128,140 B2 * 10/2006 Barmoav ................ F28F 3/048
165/185

(Continued)

FOREIGN PATENT DOCUMENTS

CN        1453861 A      11/2003
CN      101072484 A      11/2007

(Continued)

OTHER PUBLICATIONS

Written Opinion of the International Searching Authority in PCT/CN2017/090972 (Year: 2011).*

(Continued)

*Primary Examiner* — Anatoly Vortman
(74) *Attorney, Agent, or Firm* — Anova Law Group, PLLC (57) ABSTRACT

A heat dissipation structure includes a housing configured to receive a heat generating device. The housing includes a first air inlet, a first air outlet, and an alloy heat dissipation device disposed in the housing and including heat dissipation fins disposed in parallel. A heat dissipation air channel is formed between two adjacent heat dissipation fins. The heat dissipation air channel includes a second air inlet and a second air outlet, the second air outlet being connected with the first air outlet. The heat dissipation structure further includes a heat dissipation fan configured to provide a heat dissipation air flow to an inside space of the housing. The heat dissipation fan is disposed inside the housing, and includes a third air inlet and a third air outlet. The third air inlet is connected with the first air inlet and the third air outlet is connected with the second air inlet.

10 Claims, 4 Drawing Sheets

(58) Field of Classification Search
USPC .......................................................... 361/697
See application file for complete search history.

(56) References Cited

U.S. PATENT DOCUMENTS

| | | | | |
|---|---|---|---|---|
| 7,495,920 | B2* | 2/2009 | Chen | H01L 23/4006 165/121 |
| 8,703,286 | B2* | 4/2014 | Jayaraman | H05K 13/0465 428/323 |
| 8,922,990 | B1 | 12/2014 | James | |
| 2014/0032034 | A1* | 1/2014 | Raptopoulos | G05D 1/0088 701/25 |
| 2015/0362265 | A1* | 12/2015 | Broido | F16D 69/00 361/710 |

FOREIGN PATENT DOCUMENTS

| | | | | |
|---|---|---|---|---|
| CN | 101083889 | A | | 12/2007 |
| CN | 201541421 | U | | 8/2010 |
| CN | 202551577 | U | * | 11/2012 ............... H05K 7/20 |
| CN | 202551577 | U | | 11/2012 |
| CN | 202696480 | U | | 1/2013 |
| CN | 204392739 | U | | 6/2015 |
| CN | 104812222 | A | | 7/2015 |
| CN | 105756765 | A | | 7/2016 |
| CN | 205912406 | U | | 1/2017 |
| CN | 206068124 | U | | 4/2017 |
| CN | 206087260 | U | | 4/2017 |
| CN | 108702855 | A | * | 10/2018 ......... H05K 7/20145 |
| JP | H08125369 | A | | 5/1996 |

OTHER PUBLICATIONS

The World Intellectual Property Organization (WIPO) International Search Report for PCT/CN2017/090972 dated Feb. 23, 2018 6 pages.

* cited by examiner

UNMANNED AERIAL VEHICLE AND HEAT DISSIPATION STRUCTURE

CROSS-REFERENCE TO RELATED APPLICATIONS

This application is a continuation application of International Application No. PCT/CN2017/090972, filed on Jun. 30, 2017, which claims priority to Chinese Patent Application No. 201720560892.X, filed on May 19, 2017, the entire contents of both of which are incorporated herein by reference.

TECHNICAL FIELD

The present disclosure relates to the technology field of unmanned aerial vehicles and, more particularly, to an unmanned aerial vehicle and a heat dissipation structure.

BACKGROUND

A typical unmanned aerial vehicle ("UAV") may be provided with a heat dissipation structure to dissipate heat generated by a chip, a motherboard, or other heat generating devices of the UAV, thereby ensuring normal operations of the UAV. In conventional technologies, a small-sized UAV may include an axial fan brazed with a heat tube to form a heat dissipation module to dissipate heat. For a small-sized, compact UAV, this heat dissipation system has a high impedance. Because the axial fan can only produce a low wind pressure, the axial fan has a weak ability to overcome the system impedance. As a result, a heat dissipation efficiency is low. In addition, because the heat tube is used in the heat tube brazed heat dissipator, the weight of the heat tube brazed heat dissipator is heavy, which may reduce the continuous flight capability of the UAV.

Because the weight of the UAV directly affects the continuous flight capability of the UAV, the lighter the weight, the longer the continuous flight time. On one hand, the heat dissipation system needs to use metal materials having a high heat dissipation performance, which may increase the weight of the UAV. On the other hand, because a battery of the small-sized UAV has limited continuous flight capability, the increase of the weight of the heat dissipation system may further reduce the continuous flight time of the battery. The conflict between these two needs renders design of a heat dissipation system for the UAV a difficult topic that needs to be addressed.

SUMMARY

In accordance with an aspect of the present disclosure, there is provided a heat dissipation structure including a housing configured to receive a heat generating device. The housing includes a first air inlet and a first air outlet. The heat dissipation structure also includes an alloy heat dissipation device disposed in the housing and including a plurality of heat dissipation fins disposed in parallel with one another. A heat dissipation air channel is formed between two adjacent heat dissipation fins. The heat dissipation air channel includes a second air inlet and a second air outlet, the second air outlet being connected with the first air outlet. The heat dissipation structure also includes a heat dissipation fan configured to provide a heat dissipation air flow to an inside space of the housing. The heat dissipation fan is disposed inside the housing, and includes a third air inlet and a third air outlet, the third air inlet being connected with the first air inlet and the third air outlet being connected with the second air inlet.

In accordance with another aspect of the present disclosure, there is also provided an unmanned aerial vehicle including a camera assembly and a heat generating device. The unmanned aerial vehicle also includes a heat dissipation structure. The heat dissipation structure includes a housing configured to receive the heat generating device. The housing includes a first air inlet and a first air outlet. The heat dissipation structure also includes an alloy heat dissipation device disposed in the housing and including a plurality of heat dissipation fins disposed in parallel with one another. A heat dissipation air channel is formed between two adjacent heat dissipation fins. The heat dissipation air channel includes a second air inlet and a second air outlet, the second air outlet being connected with the first air outlet. The heat dissipation structure also includes a heat dissipation fan configured to provide a heat dissipation air flow to an inside space of the housing. The heat dissipation fan is disposed inside the housing, and includes a third air inlet and a third air outlet, the third air inlet being connected with the first air inlet and the third air outlet being connected with the second air inlet. The camera assembly is disposed at a front lower portion of the housing.

According to the heat dissipation structure of the present disclosure, an alloy heat dissipation device may conduct heat from a heat generating device, and may convectively exchange heat with an air flow blown by a heat dissipation fan, thereby achieving heat dissipation for the heat generating device. The heat dissipation fan may provide a sufficiently strong wind volume and wind pressure. In addition, the alloy heat dissipation device has a light weight, such that not only the heat dissipation efficiency is increased, the weight of the heat dissipation structure is also reduced. The technical solution of the present disclosure can achieve excellent heat dissipation performance, solve the difficult issue relating to weight increase in the UAV due to the heat dissipation structure, and provide an optimal balance between the heat dissipation performance and the weight reduction for the UAV. The technical solution of the present disclosure uses a light weight structure to provide a strong heat dissipation performance, and also reduces a heat dissipation space to a maximum extent.

BRIEF DESCRIPTION OF THE DRAWINGS

To better describe the technical solutions of the various embodiments of the present disclosure, the accompanying drawings showing the various embodiments will be briefly described. As a person of ordinary skill in the art would appreciate, the drawings show only some embodiments of the present disclosure. Without departing from the scope of the present disclosure, those having ordinary skills in the art could derive other embodiments and drawings based on the disclosed drawings without inventive efforts.

DETAILED DESCRIPTION OF THE EMBODIMENTS

Technical solutions of the present disclosure will be described in detail with reference to the drawings, in which the same numbers refer to the same or similar elements unless otherwise specified. It will be appreciated that the described embodiments represent some, rather than all, of the embodiments of the present disclosure. Other embodiments conceived or derived by those having ordinary skills in the art based on the described embodiments without inventive efforts should fall within the scope of the present disclosure.

Embodiments of the present disclosure shown in the drawings will be described in detail below. When describing the accompanying drawings, unless otherwise noted, the same reference number in different drawings indicate the same or similar elements. The embodiments described below do not represent all of the possible embodiments of the present disclosure. Instead, the embodiments described below are only some devices and methods that are consistent with various aspects of invention defined by the claims.

The terms used in the following descriptions are only for the purpose of describing specific embodiments, and are not intended to limit the scope of the present disclosure. In addition, the singular forms "a," "an," and "the" are intended to include the plural forms as well, unless the context indicates otherwise.

It should be understood that in the present disclosure, relational terms such as first and second, etc., are only used to distinguish an entity or operation from another entity or operation, and do not necessarily imply that there is an actual relationship or order between the entities or operations. Similarly, "a" or "one" and similar terms do not limit the number of features, but only indicate that there exists at least one feature. In addition, unless otherwise noted, the terms "front," "back" (or "rear"), "lower," and/or "upper" and other similar terms are only for the convenience of descriptions, and are not intended to limit to a particular position, location, or space orientation. The terms "comprise," "comprising," "include," and the like specify the presence of stated features, steps, operations, elements, and/or components appearing following these terms are included in an element or object appearing before these terms, but do not preclude the presence or addition of one or more other features, steps, operations, elements, components, and/or groups. When a first component is referred to as "connected" to or with a second component, it is intended that the first component may be directly connected to or with the second component or may be indirectly connected to or with the second component via an intermediate component. The connection may include mechanical and/or electrical connections. The connection may be permanent or detachable. The electrical connection may be wired or wireless. The "connection" may also refer to a connection forming a fluid conduit, such that a fluid (e.g., an air flow) may flow from one element to another element.

The term "and/or" used herein includes any suitable combination of one or more related items listed. For example, A and/or B can mean A only, A and B, and B only. The symbol "/" means "or" between the related items separated by the symbol. The phrase "at least one of" A, B, or C encompasses all combinations of A, B, and C, such as A only, B only, C only, A and B, B and C, A and C, and A, B, and C. In this regard, A and/or B can mean at least one of A or B.

The UAV and the heat dissipation structure will be described in detail with reference to the accompanying drawings. Unless otherwise noted, the embodiments shown in the drawings are not mutually exclusive, and they may be combined in any suitable manner.

Referring to FIG. 1-FIG. 4, the structure of the UAV is shown. A UAV 1 may include a heat generating device 90. The present disclosure provides a heat dissipation structure. The heat dissipation structure may be disposed in the UAV 1 and may be configured to dissipate heat generated by the heat generating device 90. The heat dissipation structure may include a housing 10 and a metal alloy heat dissipation device 20.

The housing 10 may be configured to receive or accommodate the heat generating device 90. The housing 10 may include a first air inlet 101 and a first air outlet 102.

The metal alloy heat dissipation device 20 may be disposed within the housing 10. The metal alloy heat dissipation device 20 may include a plurality of heat dissipation fins 290 that are disposed in parallel with one another. A heat dissipation air channel 200 may be formed between two adjacent heat dissipation fins 290. Each heat dissipation air channel 200 may include a second air inlet 201 and a second air outlet 202. The second air outlet 202 may be connected with the first air outlet 102 to allow an air to flow therethrough.

In some embodiments, a heat dissipation fan 30 configured to provide a heat dissipation air flow to an inside space of the housing 10 may be provided in the housing 10. The heat dissipation fan 30 may include a third air inlet 301 and a third air outlet 302. The third air inlet 301 and the first air inlet 101 may be connected to allow an air to flow therethrough. The third air outlet 302 and the second air inlet 201 may be connected to allow an air to flow therethrough.

In some embodiments, in the present heat dissipation structure, the metal alloy heat dissipation device 20 may conduct heat from the heat generating device 90, and may exchange heat with the heat dissipation air flow blown by the heat dissipation fan 30 through convective heat exchange, thereby dissipating heat from the heat generating device 90. The heat dissipation fan 30 may provide a strong wind volume and wind pressure. In some embodiments, the metal alloy heat dissipation device 20 may have a light weight. Thus, the heat dissipation structure of the present disclosure may increase heat dissipation efficiency and reduce the weight of the heat dissipation structure. Hence, the present disclosure can not only improve heat dissipation performance, but also solve the difficulty issue relating to weight increase in the UAV 1 due to the heat dissipation structure. The present disclosure optimally balances the heat dissipation performance and the weight reduction of the UAV 1. The present disclosure also provides the strongest heat dissipation performance with the least weight, and reduces a heat dissipation space to the maximum extent.

Figure 4:
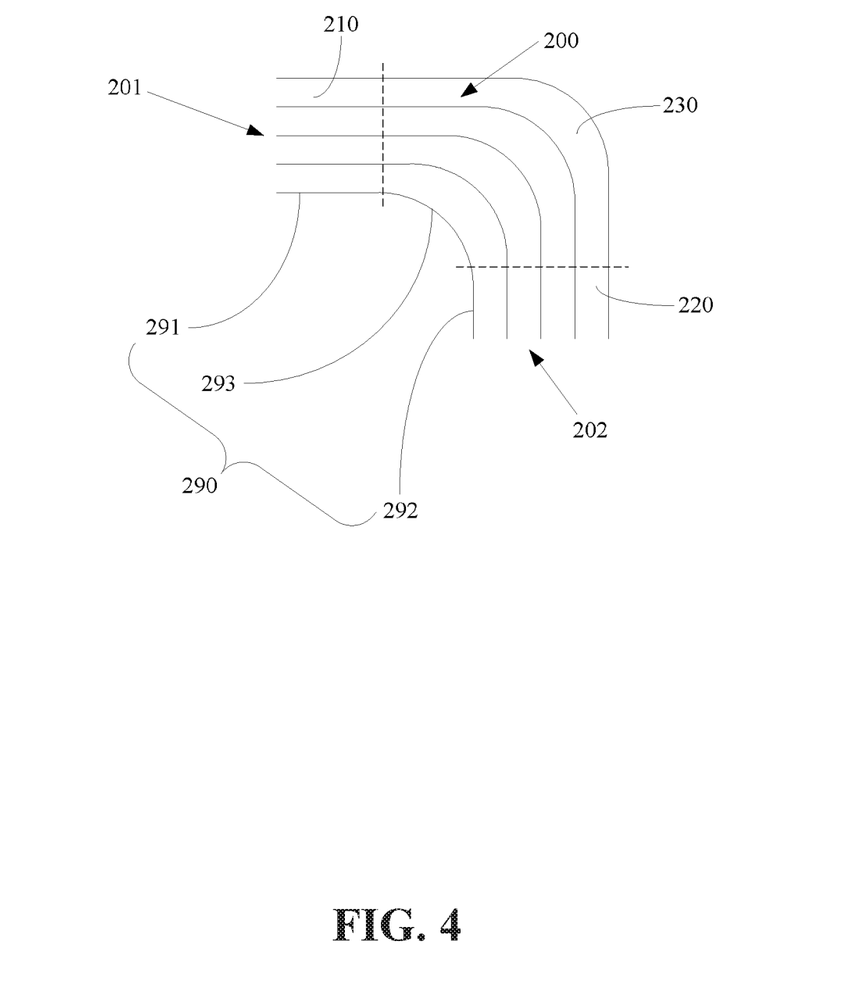
FIG. 4 is a schematic illustration of a metal alloy heat dissipation device, according to an example embodiment.

Referring to FIG. 4, in some embodiments, the heat dissipation air channel 200 may include a first air channel 210, a second air channel 220, and a third air channel 230 located between the first air channel 201 and the second air channel 220. Each of the heat dissipation fins 290 may include a first fin portion 291, a second pin portion 292, and an arc-shaped transition portion 293 connecting the first fin portion 291 and the second fin portion 292. The first fin portion 291 and the second fin portion 292 may be slantly disposed through the arc-shaped transition portion 293. Two adjacent first fin portions 291 of two heat dissipation fins 290 may form the first air channel 210. Two adjacent second fin portions 292 of two heat dissipation fins 290 may form the second air channel 220. Two adjacent arc-shaped transition portions 293 of two heat dissipation fins 290 may form the third air channel 230. An angle between the first fin portion 291 and the second fin portion 292 may be between 90° and 120°, such as, for example, 90°. The disclosed configuration increases a contact area between the heat dissipation air flow and the heat dissipation fins 290, thereby improving the convective heat exchange effect, increasing the heat dissipation efficiency, and achieving a better heat dissipation effect for the heat generating device 90.

Figure 1:
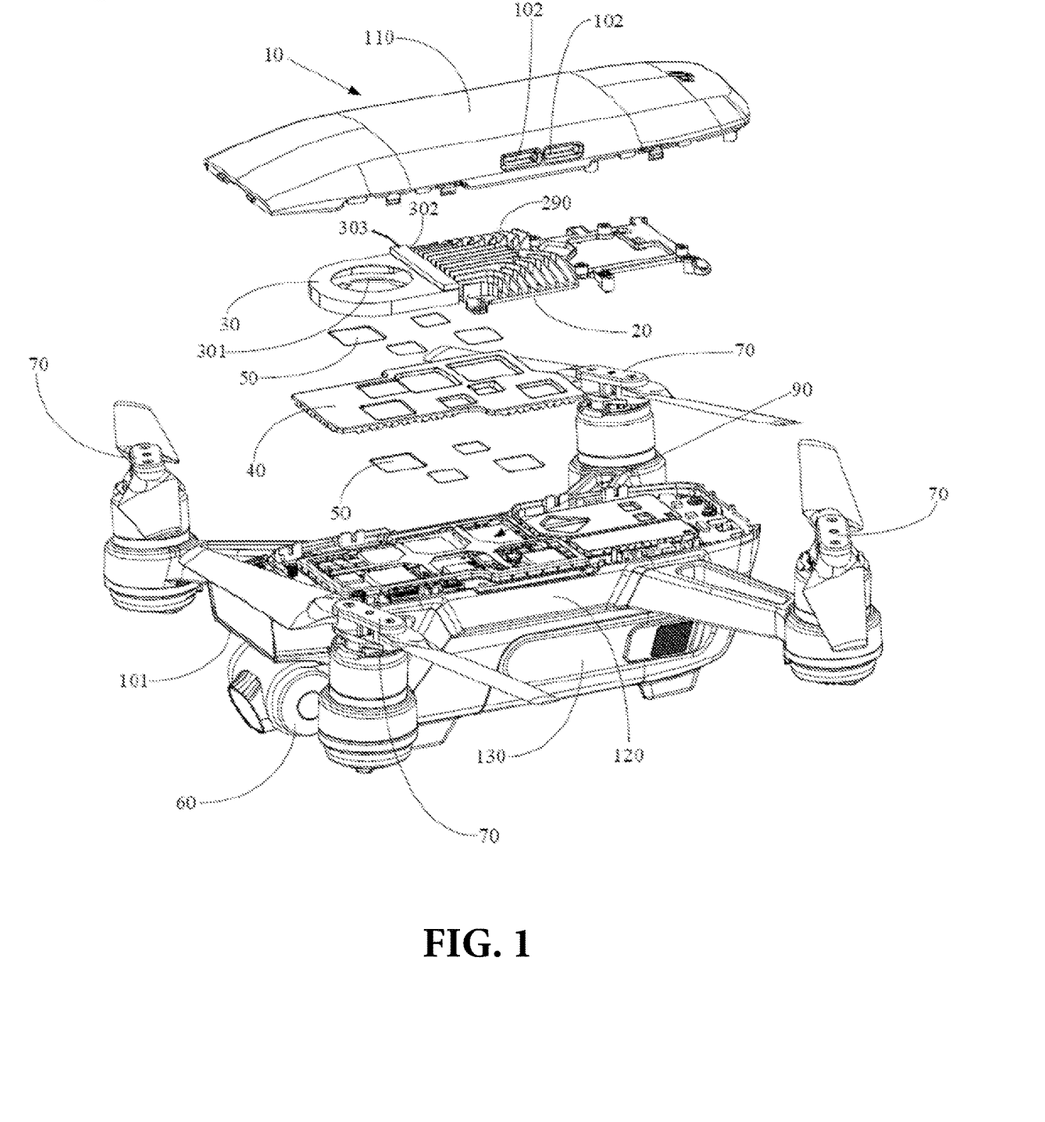
FIG. 1 is an exploded view of a UAV, according to an example embodiment.
Figure 3:
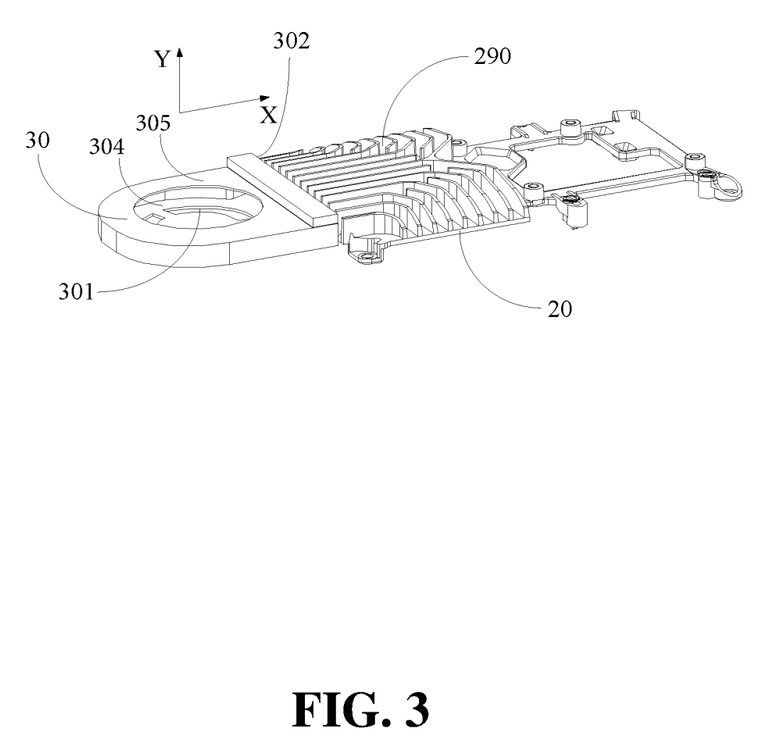
FIG. 3 is an enlarged view of a metal alloy heat dissipation device and a heat dissipation fan, according to an example embodiment.

Referring to FIG. 1 and FIG. 3, in some embodiments, the housing 10 may include two air outlet groups. Each air outlet group may include at least one first air outlet 102. The two air outlet groups may be disposed at two opposing sides of the housing 10 respectively. The plurality of heat dissipation fins 290 may include two heat dissipation fin groups. Heat dissipation air channels 200 of the two heat dissipation fin groups may be symmetrically disposed relative to the housing 10, such that the second air outlets 202 of the heat dissipation air channel 200 of the two heat dissipation fin groups correspond to the first air outlets 102 of the two air outlet groups. As shown in FIG. 1, each air outlet group may include two first air outlets 102. This configuration may enable the heat dissipation air flow to uniformly flow in the housing 10. The heat dissipation air flow may flow out from two sides of the housing 10 simultaneously through the heat dissipation air channels 200 of the two heat dissipation fin groups. As a result, heat generated by the heat generating device 90 may be more uniformly dissipated, which may result in an improved heat dissipation efficiency.

In some embodiments, the heat dissipation fan 30 may include a first fan housing 304 and a second fan housing 305 enclosing the first fan housing 304. The first fan housing 304 may be a metal alloy housing. The second fan housing 305 may be a plastic housing. Thus, the heat dissipation fan 30 may not only increases the strength of the structure, but also reduces the weight of the structure. In some embodiments, the first fan housing 304 may be a copper alloy housing, which may help the heat generating device 90 effectively dissipate heat.

In some embodiments, the metal alloy heat dissipation device 20 may be a Magnesium alloy heat dissipation device. In other words, the heat dissipation fins 290 may include a Magnesium alloy material, which may further reduce the weight of the metal alloy heat dissipation device 20. The heat dissipation fan 30 may be a thin centrifugal fan. In other words, an opening direction of the third air inlet 301 of the heat dissipation fan 30 may be disposed in parallel with the axis direction (e.g., the Y direction shown in FIG. 3) of the heat dissipation fan 30. An opening direction (e.g., the X direction shown in FIG. 3) of the third air outlet 302 of the heat dissipation fan 30 may be disposed perpendicularly with an axis direction (e.g., the Y direction shown in FIG. 3). The heat dissipation fan 30 may provide a strong wind volume and strong wind pressure to more effectively dissipate heat generated by the heat generating device 90.

In some embodiments, the heat dissipation fan 30 may draw cold air through the first air inlet 101 disposed on the housing 10, which may be connected with the third air inlet 301. The heat dissipation fan 30 may blow the heat dissipation air flow out through the third air outlet 302. The heat dissipation air flow may flow into the heat dissipation air channel 200 of the alloy heat dissipation device 20 through the second air inlet 201 of the heat dissipation air channel 200 of the alloy heat dissipation device 20. The alloy heat dissipation device 20 may conduct heat from the heat generating device 90, and may convectively exchange heat with the heat dissipation air flow blown by the heat dissipation fan 30, thereby achieving heat dissipation for the heat generating device 90. The heat dissipation air flow may exit the housing 10 from two sides of the housing 10 through the first air outlets 102 provided on the housing 10 that are connected with the second air outlets 202 of the heat dissipation air channel 200 of the alloy heat dissipation device 20, thereby forming a complete heat dissipation system. In some embodiments, the heat dissipation fan 30 may have a thin centrifugal fan to provide a strong wind volume and wind pressure. In some embodiments, the alloy heat dissipation device 20 may be a Magnesium heat dissipation device, which may further reduce the weight of the heat dissipation structure. Thus, the heat dissipation structure of the present disclosure may not only increase the heat dissipation efficiency, but also reduce the weight of the heat dissipation structure. In addition, the heat dissipation structure of the present disclosure may not only improve heat dissipation performance, but also solve the difficult issue of UAV 1 weight increase due to the heat dissipation structure. The present disclosure provides an optimal balance between the heat dissipation performance and the weight reduction of the UAV 1. The present disclosure also provides the strongest heat dissipation performance with the smallest weight, and can save the heat dissipation space to the maximum extent.

In some embodiments, a shielding cover 40 may be provided between the heat generating device 90 and the alloy heat dissipation device 20. In some embodiments, the shielding cover 40 may be a copper alloy shielding cover. In some embodiments, heat conducting gels 50 may be provided between the shielding cover 40 and the heat generating device 90 and between the shielding cover 40 and the allow heat dissipation device 20.

In some embodiments, the shielding cover 40 may include a copper alloy with a high heat conduction coefficient to increase heat dissipation. Because fins of complex air channel cannot be provided onto the shielding cover 40 through brazing, the shielding cover 40 and the alloy heat dissipation device 20 may be independently disposed. The shielding cover 40 may provide not only a shielding function, but also a heat dissipation function. The heat dissipation fins 290 of the alloy heat dissipation device 20 may form corresponding heat dissipation air channels 200 based on the location of the first air outlet 102. The heat conducting gels 50 may fill air gaps between the shielding cover 40 and the heat generating device 90 and between the shielding cover 40 and the alloy heat dissipation device 20, which may also dissipate heat from the heat generating device 90.

In some embodiments, wind blocking foams may be provided between the heat dissipation fan 30 and the housing 10 and between the alloy heat dissipation device 20 and the housing 10. For example, the wind blocking foams 303 may be provided right above the third air outlet 302 of the heat dissipation fan 30, to restrain the heat dissipation fan 30 from sucking in hot air from the third air inlet 301. The wind blocking foams may be provided above the alloy heat dissipation device 20 to avoid leakage of the heat dissipation air flow. As a result, the cold air drawn from the first air inlet 101 of the housing 10 may flow quickly and efficiently through all key locations after passing through the heat dissipation fan 30, to highly effectively take heat away from the heat generating device 90. Accordingly, a stable and reliable operating environment may be provided to a small-sized UAV.

Figure 2:
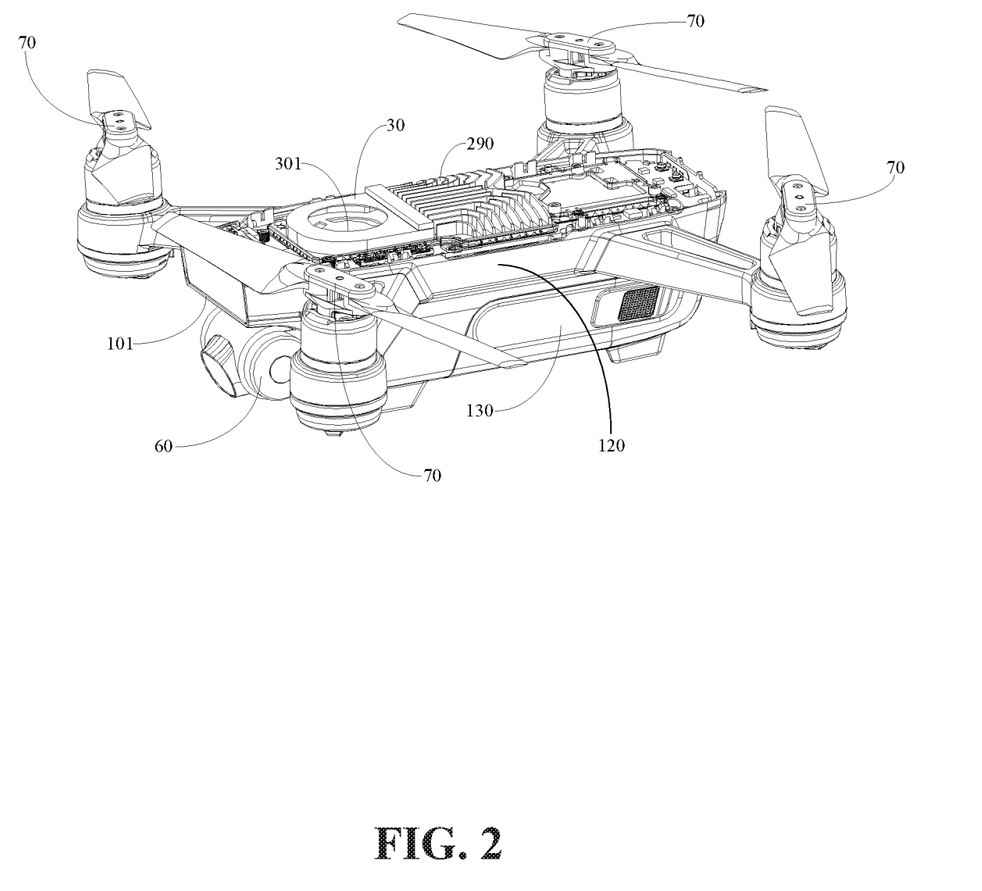
FIG. 2 is a perspective view of a structure of the UAV with a first housing removed, according to an example embodiment.

Referring to FIG. 1 and FIG. 2, the UAV 1 may include a camera assembly 60, a propeller assembly 70, the heat generating device 90, and the heat dissipation structure described above. The camera assembly 60 may be provided at a front lower portion of the housing 10. The propeller assembly 70 may be provided around the housing 10 at various locations. The heat generating device 90 may include a circuit board, a battery module 130, or other heat generating devices or parts.

In some embodiments, in the UAV 1 of the present disclosure, the alloy heat dissipation device 20 of the heat dissipation structure may conduct heat from the heat generating device 90 through convective heat exchange. The alloy heat dissipation device 20 may exchange heat with the heat dissipation air flow blown by the heat dissipation fan 30, thereby dissipating heat for the heat generating device 90. The configurations of the air inlets and air outlets of the heat dissipation fan 30 (e.g., the configurations of the third air inlet 301 and the third air outlet 302) may provide a strong wind volume and wind pressure. In addition, the alloy heat dissipation device 20 is light weight, which can not only increase the heat dissipation efficiency, but also reduce the weight of the heat dissipation structure. As a result, the disclosed heat dissipation structure can not only improve the heat dissipation performance, but also solve the difficulty issue of UAV 1 weight increase due to the heat dissipation structure. The present disclosure optimally balances the heat dissipation performance and the weight reduction of the UAV 1. The present disclosure also provides the strongest heat dissipation performance with the smallest weight, and saves the heat dissipation space to the maximum extent.

In some embodiments, the first air inlet 101 and the camera assembly 60 are located on the same side of the housing 10. The first air inlet 101 may be provided at a bottom side of the housing 10. The heat dissipation structure draws cold air from the front lower portion of the housing 10, and expels hot air from two sides of the middle portion of the housing 10, thereby forming a high-efficiency heat dissipation channel to dissipate heat generated by the heat generating device 90 disposed inside the UAV 1. The heat dissipation cold air flow drawn from outside environment may also dissipate heat for the camera assembly 60 to enable the camera assembly 60 to function stably and reliably.

In some embodiments, the housing 10 may include a first housing 110 and a second housing 120. The first housing 110 and the second housing 120 may form a receiving space therebetween. The alloy heat dissipation device 20, the heat dissipation fan 30, and the heat generating device 90 may be disposed in the receiving space. In some embodiments, the first housing 110 and the second housing 120 may be plastic housings. In some embodiments, a battery module 130 may be provided below the second housing 120.

In some embodiments, the UAV 1 of the present disclosure includes a heat dissipation structure including a thin centrifugal fan and a Magnesium alloy heat dissipation device. Cold air may be drawn from the external environment from a front lower portion of the housing 10, and hot air may be blown out from two sides of the middle portion of the housing 10, thereby forming a high-efficiency heat dissipation channel to dissipate heat from the heat generating device 90 disposed inside the UAV 1. Because the heat dissipation fins 290 of the alloy heat dissipation device 20 are not exposed, the internal structure of the entire UAV 1 are enclosed by a plastic housing. When a user or operator touches the external plastic surface of the UAV 1, the user or operator would not have a scorching feeling on the hand. Further, because the heat dissipation fan 30 is separated by the housing of the UAV 1 from the external environment, the acoustic noise is effectively insulated, and the noise level is reduced.

The above descriptions explain in detail the various embodiments of the disclosed structures. The above descriptions use detailed examples to explain the principle and implementation of the disclosed structures. These explanations of the various embodiments are intended to facilitate the understanding of the disclosed structures and the ideas. A person having ordinary skills in the art may modify the detailed implementation and the application scope based on the present disclosure. Thus, the content of the present specification should not be interpreted as being limiting the scope of the present disclosure.

Other embodiments of the present disclosure will be apparent to those skilled in the art from consideration of the specification and practice of the embodiments disclosed herein. It is intended that the specification and examples be considered as example only and not to limit the scope of the present disclosure, with a true scope and spirit of the invention being indicated by the following claims. Variations or equivalents derived from the disclosed embodiments also fall within the scope of the present disclosure.

What is claimed is:

1. A heat dissipation structure, comprising:
   a housing configured to receive a heat generating device, the housing comprising a first air inlet and a first air outlet;
   an alloy heat dissipation device fully accommodated in the housing and comprising a plurality of heat dissipation fins disposed in parallel with one another, wherein a heat dissipation air channel is formed between two adjacent heat dissipation fins, and wherein the heat dissipation air channel comprises a second air inlet and a second air outlet, the second air outlet being connected with the first air outlet; and
   a heat dissipation fan configured to provide a heat dissipation air flow to an inside space of the housing, the heat dissipation fan including a first fan housing and a second fan housing enclosing the first fan housing, the first fan housing being an alloy housing and the second fan housing being a plastic housing, wherein the heat dissipation fan is disposed inside the housing, and comprises a third air inlet and a third air outlet, the third air inlet being connected with the first air inlet and the third air outlet being connected with the second air inlet.

2. The heat dissipation structure of claim 1,
   wherein the heat dissipation air channel comprises a first air channel and a second air channel,
   wherein each of the heat dissipation fins comprises a first fin portion and a second fin portion, the first fin portion and the second fin portion being slantly disposed, and
   wherein two first fin portions of two adjacent heat dissipation fins form the first air channel, and two second fin portions of the two adjacent heat dissipation fins form the second air channel.

3. The heat dissipation structure of claim 2,
   wherein the heat dissipation air channel comprises a third air channel located between the first air channel and the second air channel,
   wherein each of the heat dissipation fins comprises an arc-shaped transition portion connecting the first fin portion and the second fin portion, and wherein two arc-shaped transition portions of the two adjacent heat dissipation fins form the third air channel.

4. The heat dissipation structure of claim 1, wherein the housing comprises two air outlet groups, each of the two air outlet groups comprises at least one first air outlet, and the two air outlet groups are disposed on two opposing sides of the housing, wherein the plurality of heat dissipation fins comprise two heat dissipation fin groups, and wherein heat dissipation air channels of the two heat dissipation fin groups are symmetrically disposed relative to the housing.

5. The heat dissipation structure of claim 1, further comprising:

a shielding cover disposed between the heat generating device and the alloy heat dissipation device.

6. The heat dissipation structure of claim 5, wherein heat conducting gels are provided between the shielding cover and the heat generating device and between the shielding cover and the alloy heat dissipation device.

7. The heat dissipation structure of claim 1, wherein wind blocking foams are disposed between the heat dissipation fan and the housing and between the alloy heat dissipation device and the housing.

8. The heat dissipation structure of claim 1, further comprising:

a wind blocking foam disposed right above the third air outlet and between the heat dissipation fan and the housing.

9. An unmanned aerial vehicle, comprising:
a camera assembly;
a heat generating device; and
a heat dissipation structure comprising:
  a housing configured to receive the heat generating device, the housing comprising a first air inlet and a first air outlet;
  an alloy heat dissipation device fully accommodated in the housing and comprising a plurality of heat dissipation fins disposed in parallel with one another, wherein a heat dissipation air channel is formed between two adjacent heat dissipation fins, and wherein the heat dissipation air channel comprises a second air inlet and a second air outlet, the second air outlet being connected with the first air outlet; and
  a heat dissipation fan configured to provide a heat dissipation air flow to an inside space of the housing, the heat dissipation fan including a first fan housing and a second fan housing enclosing the first fan housing, the first fan housing being an alloy housing and the second fan housing being a plastic housing, wherein the heat dissipation fan is disposed inside the housing, and comprises a third air inlet and a third air outlet, the third air inlet being connected with the first air inlet and the third air outlet being connected with the second air inlet,
wherein the camera assembly is disposed at a front lower portion of the housing.

10. The unmanned aerial vehicle of claim 9, wherein the first air inlet and the camera assembly are located on a same side of the housing and are disposed at a bottom of the housing.

* * * * *